(12) United States Patent
Hsieh et al.

(10) Patent No.: US 11,680,853 B2
(45) Date of Patent: Jun. 20, 2023

(54) TIMING-TOLERANT OPTICAL PULSE ENERGY CONVERSION CIRCUIT COMPRISING AT LEAST ONE SEQUENTIAL LOGIC CIRCUIT FOR ADJUSTING A WIDTH WINDOW OF AT LEAST ONE DETECTED VOLTAGE PULSE ACCORDING TO A PREDETERMINED DELAY

(71) Applicant: Rockwell Collins, Inc., Cedar Rapids, IA (US)

(72) Inventors: Han Chi Hsieh, Gaithersburg, MD (US); Wenlu Chen, Clarksville, MD (US); Oliver S. King, Frederick, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 156 days.

(21) Appl. No.: 17/392,859

(22) Filed: Aug. 3, 2021

(65) Prior Publication Data
US 2023/0038468 A1 Feb. 9, 2023

(51) Int. Cl.
*H03K 3/017* (2006.01)
*G01J 11/00* (2006.01)
*H03K 3/037* (2006.01)

(52) U.S. Cl.
CPC .............. *G01J 11/00* (2013.01); *H03K 3/037* (2013.01)

(58) Field of Classification Search
CPC ...... G01J 11/00; G01J 2011/005; H03K 3/00; H03K 3/017; H03K 3/027; H03K 3/37
USPC .......................................... 250/214 R, 214.1
See application file for complete search history.

(56) References Cited

U.S. PATENT DOCUMENTS

| | | |
|---|---|---|
| 3,471,790 A | 10/1969 | Kaps |
| 5,245,557 A | 9/1993 | Upton |
| 5,708,381 A | 1/1998 | Higashisaka |
| 6,785,194 B1 | 8/2004 | Peck et al. |
| 7,545,304 B1 | 6/2009 | Wu et al. |
| 10,075,154 B1 | 9/2018 | Hsieh |
| 11,557,708 B2 * | 1/2023 | Rufenacht ............ H10N 60/82 |
| 2019/0386647 A1 | 12/2019 | Johnson et al. |
| 2020/0083961 A1 | 3/2020 | Wu et al. |

* cited by examiner

*Primary Examiner* — Que Tan Le
(74) *Attorney, Agent, or Firm* — Suiter Swantz pc llo

(57) ABSTRACT

A circuit and method for timing-tolerant optical pulse energy electrical conversion receives a current pulse stream converted from an input optical pulse stream (which may be periodic or nonperiodic), converts the current pulse stream to an electrical waveform of voltage pulses and detects each voltage pulse, e.g., by its leading edge. The conversion circuit may include a divider circuit for receiving the electrical waveform, dividing the waveform into a multi-channel output of divided electrical waveforms, and sequential logic circuits for adjusting a width window of each voltage pulse according to an adjustable delay.

10 Claims, 9 Drawing Sheets

TIMING-TOLERANT OPTICAL PULSE ENERGY CONVERSION CIRCUIT COMPRISING AT LEAST ONE SEQUENTIAL LOGIC CIRCUIT FOR ADJUSTING A WIDTH WINDOW OF AT LEAST ONE DETECTED VOLTAGE PULSE ACCORDING TO A PREDETERMINED DELAY

BACKGROUND

In optical electronics, photodetected optical pulse energy is converted to a voltage signal for processing via conversion circuits, e.g., integrate-and-dump (I/D) circuits. For example, I/D circuits may operate in two alternating phases or modes, an integrate phase and a dump phase. During the integrate phase, the I/D circuit integrates the optical pulse energy of an inbound optical pulse stream and generates a corresponding voltage output (e.g., over a capacitor). During the dump phase, the charge on the capacitor is dumped, resetting the circuit to zero for the next integration phase. Conventional I/D circuits are driven by periodic clocks, which may limit effectiveness with respect to arbitrary or nonperiodic optical pulses. For example, a pulse time may only be offset so much and still be captured within an integrate window of limited width. Alternatively, the width of the integrate window may be broadened to accommodate a larger offset range, but the wider integrate window may lead to additional noise above and beyond a pulse capture. In addition, some optical pulses may fall outside the sampling window entirely.

SUMMARY

A timing-tolerant optical pulse energy conversion circuit is disclosed. In embodiments, the timing-tolerant optical pulse energy conversion circuit includes a photodetector for receiving an input optical pulse stream and converting each optical pulse to a corresponding current pulse. The conversion circuit includes a current-to-voltage conversion circuit (e.g., a transimpedance amplifier circuit) for converting each current pulse to a corresponding output voltage pulse and outputting a converted electrical waveform corresponding to the current pulse stream. The conversion circuit includes a sequential logic circuit (e.g., set-reset flip-flips) with an adjustable delay circuit. For example, the sequential logic circuit detects converted voltage pulses and outputs an adjusted-width divided electrical waveform by adjusting the width of a capture window (e.g., a pulse width of each converted voltage pulse) according to a predetermined delay.

In some embodiments, the input optical pulse stream (and therefore the converted current pulse stream) may be periodic or nonperiodic.

In some embodiments, the sequential logic circuit may detect a converted voltage pulse by its leading edge.

In some embodiments, the conversion circuit is an N-channel circuit (where N≥2) including an array of N sequential logic circuits. The conversion circuit further includes a divide-by-N divider circuit comprising a series of N latches and a combination logic circuit. The divider circuit generates clock signals for the N sequential logic circuits based on the voltage pulses of the converted electrical waveform, such that each Mth of N (M≥N) sequential logic circuit outputs (via each Mth of N output channels) a divided electrical waveform comprising each Mth voltage pulse of the original converted electrical waveform.

A method for multi-channel (e.g., N-channel, N≥2) timing-tolerant optical pulse energy conversion is also disclosed. In embodiments, the method includes receiving, via an optical-to-current conversion device (e.g., photodetector), an input optical pulse stream. The method includes converting the optical pulse stream via the optical-to-current conversion device to a current pulse stream comprising a sequence of current pulses, each current pulse corresponding to an optical pulse of the input optical pulse stream. The method includes converting the current pulse stream to an electrical waveform comprising voltage pulses corresponding to the current pulses. The method includes generating, via a divider circuit, N divided electrical waveforms, each divided electrical waveform a subset of the original converted electrical waveform. The method includes generating N adjusted electrical waveforms (via N sequential logic circuits) by adjusting a pulse width of each voltage pulse of the N divided electrical waveforms. The method includes outputting the N adjusted electrical waveforms via N output channels.

In some embodiments, the input optical pulse stream (and therefore the converted current pulse stream) comprises a nonperiodic sequence of current pulses. In some embodiments, the method includes generating N divided electrical waveforms wherein each Mth divided electrical waveform comprises each Mth voltage pulse of the converted electrical waveform (M≥N).

In some embodiments, the method includes detecting, via the sequential logic circuits, voltage pulses by their leading edges.

In some embodiments, the method includes adjusting the pulse width of each voltage pulse of each divided electrical waveform according to a predetermined delay.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
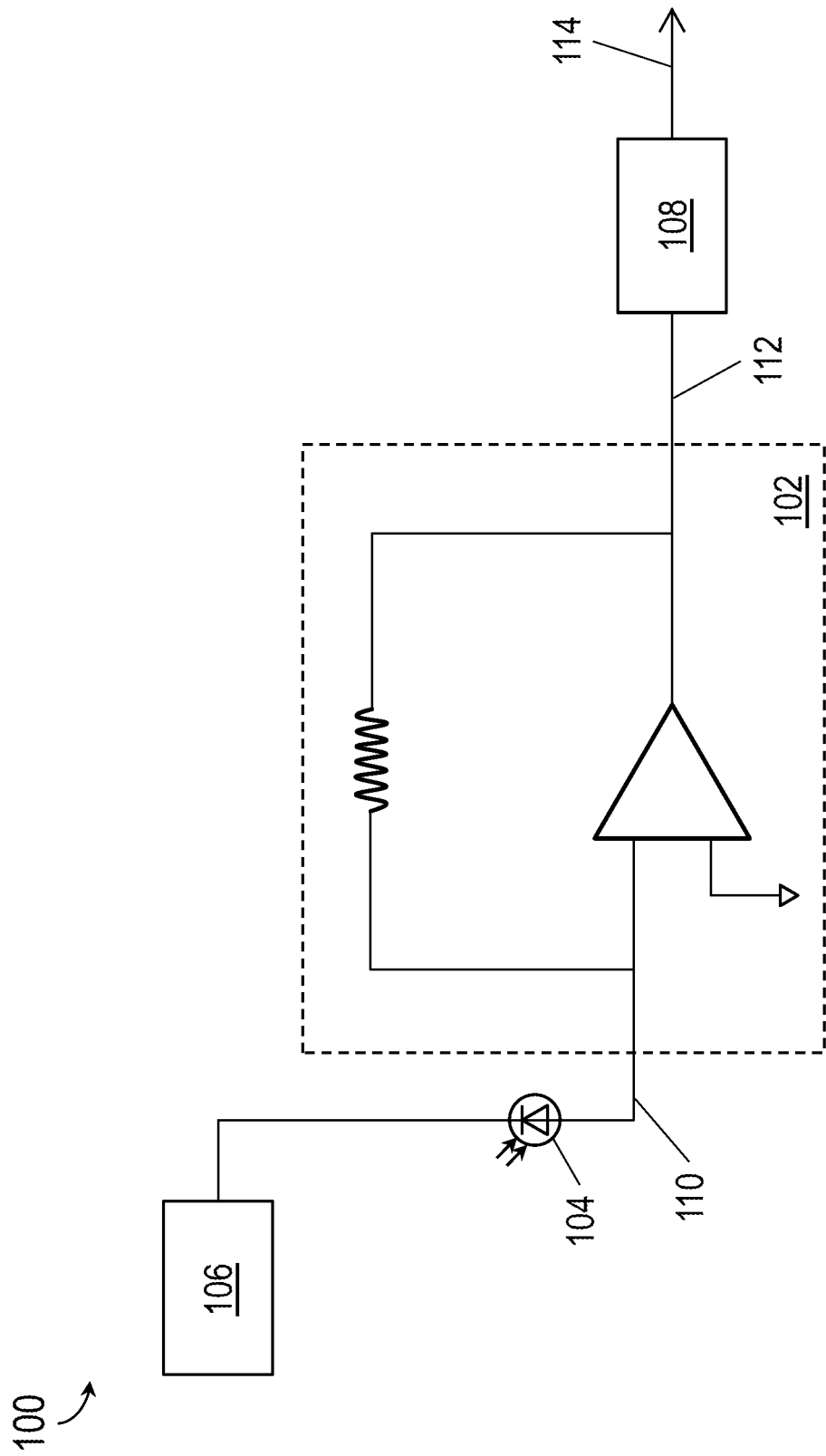
FIG. 1 is a diagrammatic illustration of a timing-tolerant optical pulse energy conversion circuit according to example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Referring to FIG. 1, a timing-tolerant optical-to-electrical pulse energy conversion circuit 100 is disclosed. The conversion circuit 100 may include: a current-to-voltage conversion circuit 102, (e.g., a transimpedance amplifier or other like conversion circuit); a photodetector 104 (e.g., or like optical-to-current conversion device) configured to receive an optical pulse stream 106; and an edge-triggered sequential logic circuit 108.

In embodiments, the photodetector 104 may receive an optical pulse stream 106 and convert the optical pulse stream to an electrical current pulse stream 110. The current pulse stream may be converted (e.g., by the current-to-voltage conversion circuit 102) to a converted electrical waveform 112, e.g., a converted voltage pulse stream. For example, each input optical pulse of the optical pulse stream 106 may be converted by the photodetector 104 to an electrical current pulse. Similarly, the current-to-voltage conversion circuit 102 may convert each current pulse to an electrical voltage pulse having a width window (e.g., pulse width), e.g., by integrating the current pulse energy across a capture window.

In embodiments, the sequential logic circuit 108 may generate an adjusted-width electrical waveform 114 based on the converted electrical waveform 112. For example, the sequential logic circuit 108 may adjust the width of the capture window, and therefore the pulse width of each voltage pulse of the converted electrical waveform 112, resulting in an adjusted-width electrical waveform 114.

Figure 2A:
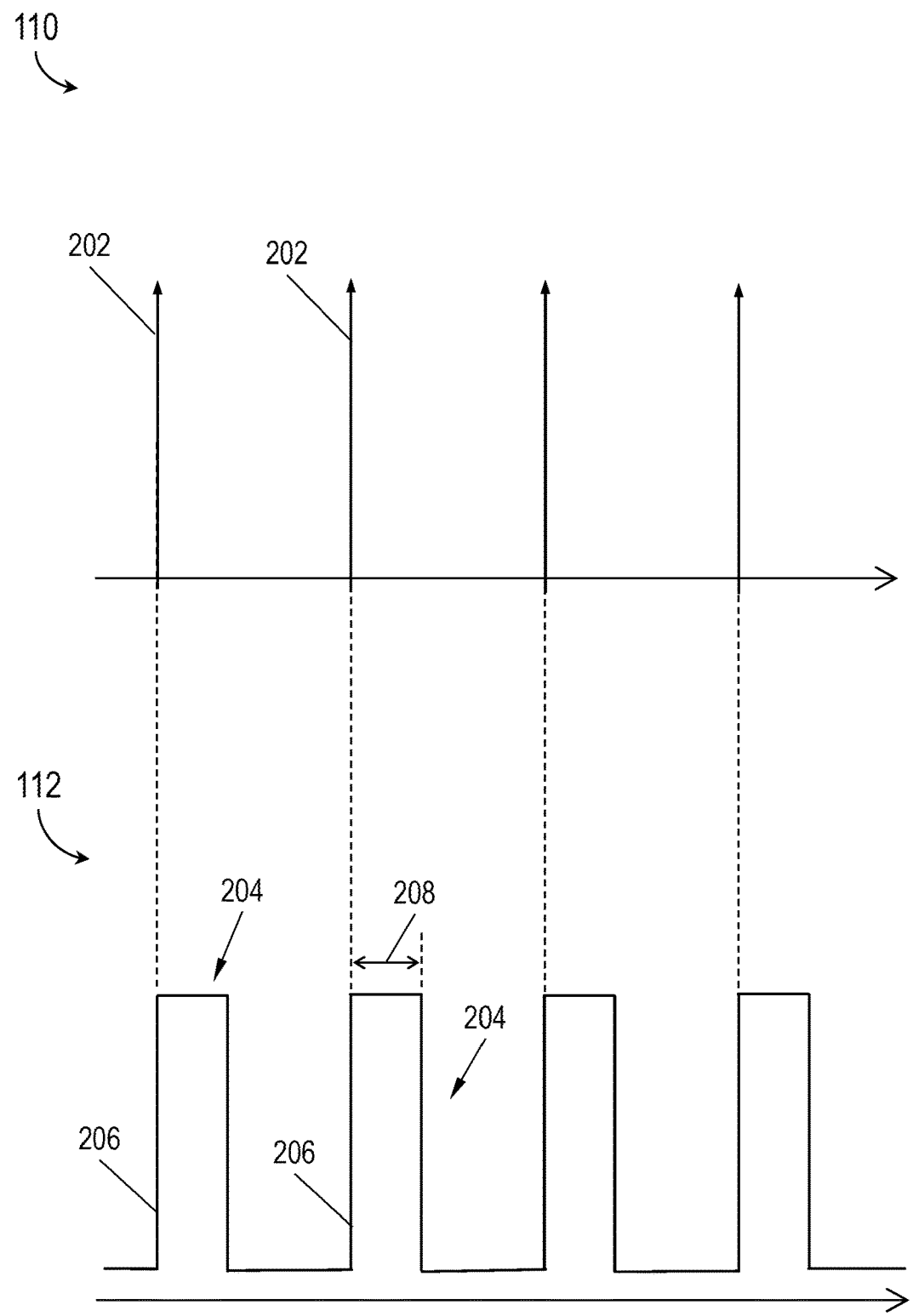
FIG. 2A illustrates a periodic input optical pulse stream received by the timing-tolerant optical pulse energy conversion circuit of FIG. 1.
Figure 2B:
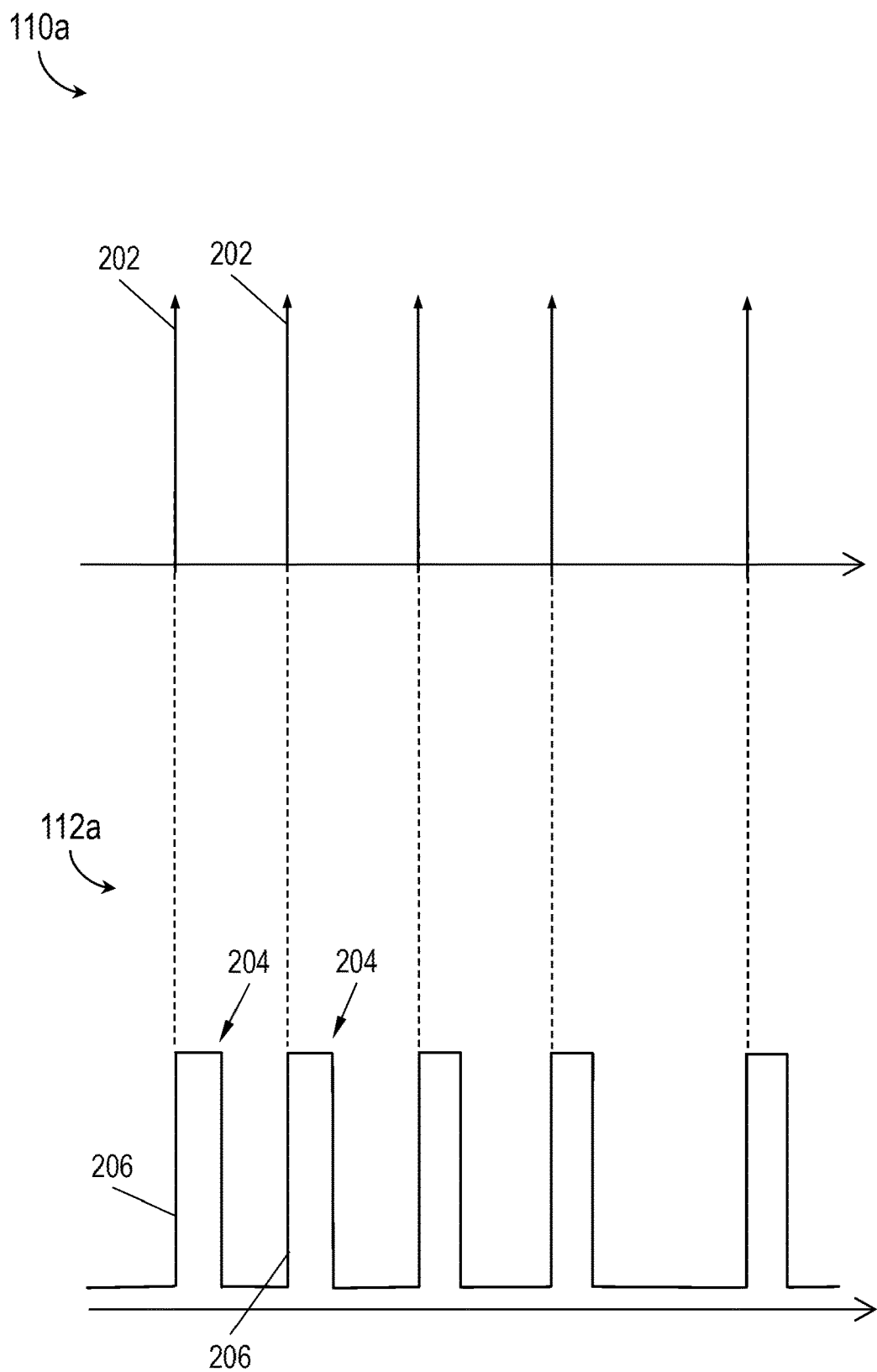
FIG. 2B illustrates a nonperiodic input optical pulse stream received by the timing-tolerant optical pulse energy conversion circuit of FIG. 1.

In embodiments, referring also to FIGS. 2A and 2B, a periodic current pulse stream 110 and a nonperiodic current pulse stream 110a (e.g., based respectively on a periodic and non-periodic optical pulse stream 106), and voltage pulse streams 112, 112a (e.g., converted electrical waveforms) respectively converted therefrom by the conversion circuit 100 of FIG. 1, are shown.

In embodiments, each current pulse stream 110 (e.g., periodic 110, nonperiodic 110a) may comprise a sequence of current pulses 202. For example, the timing of the individual voltage pulses 204 comprising the converted electrical waveforms 112, 112a may reflect the periodicity (or lack thereof) of the corresponding periodic and nonperiodic current pulse streams 110, 110a. While the current pulse stream 110 and converted electrical waveform 112 need not be nonperiodic (see, e.g., FIG. 2A), in embodiments the conversion circuit 100 may be configured for optimal conversion of nonperiodic current pulse streams 110a (e.g., or nonperiodic converted electrical waveforms 112a, FIG. 2B) as well as periodic current pulse streams or converted electrical waveforms, e.g., while maintaining superior optical jitter performance by desensitizing electronic jitter.

In embodiments, the sequential logic circuit (108, FIG. 1) may be an edge-triggered sequential logic circuit configured for detection of each leading edge 206 of a converted voltage pulse 204. For example, the sequential logic circuit 108 may incorporate an adjustable delay circuit (see, e.g., FIG. 4B) configured for adjusting the pulse width of each converted voltage pulse 204. The adjusted pulse width may be narrower or wider than the pulse width (208) of a converted voltage pulse 204. For example, when a leading edge 206 of a converted voltage pulse 204 is detected, the sequential logic circuit 108 may produce an adjusted-width voltage pulse (see, e.g., FIGS. 5 and 6 below) corresponding to the detected converted voltage pulse, e.g., for incorporation into an adjusted-width electrical waveform (114, FIG. 1) based on the converted electrical waveform 112, 112a.

In embodiments, the input optical pulse stream 106, the converted current pulse stream 110, the converted electrical waveform 112, and/or the adjusted-width electrical waveform 114 may include either single-ended or differential signals as needed or desired. In some embodiments, the converted, divided, or adjusted-width electrical waveforms may provide timing information for an integrate-and-dump (I/D) circuit, such that the I/D circuit can accurately convert nonperiodic optical pulse streams to electrical waveforms.

Figure 3:
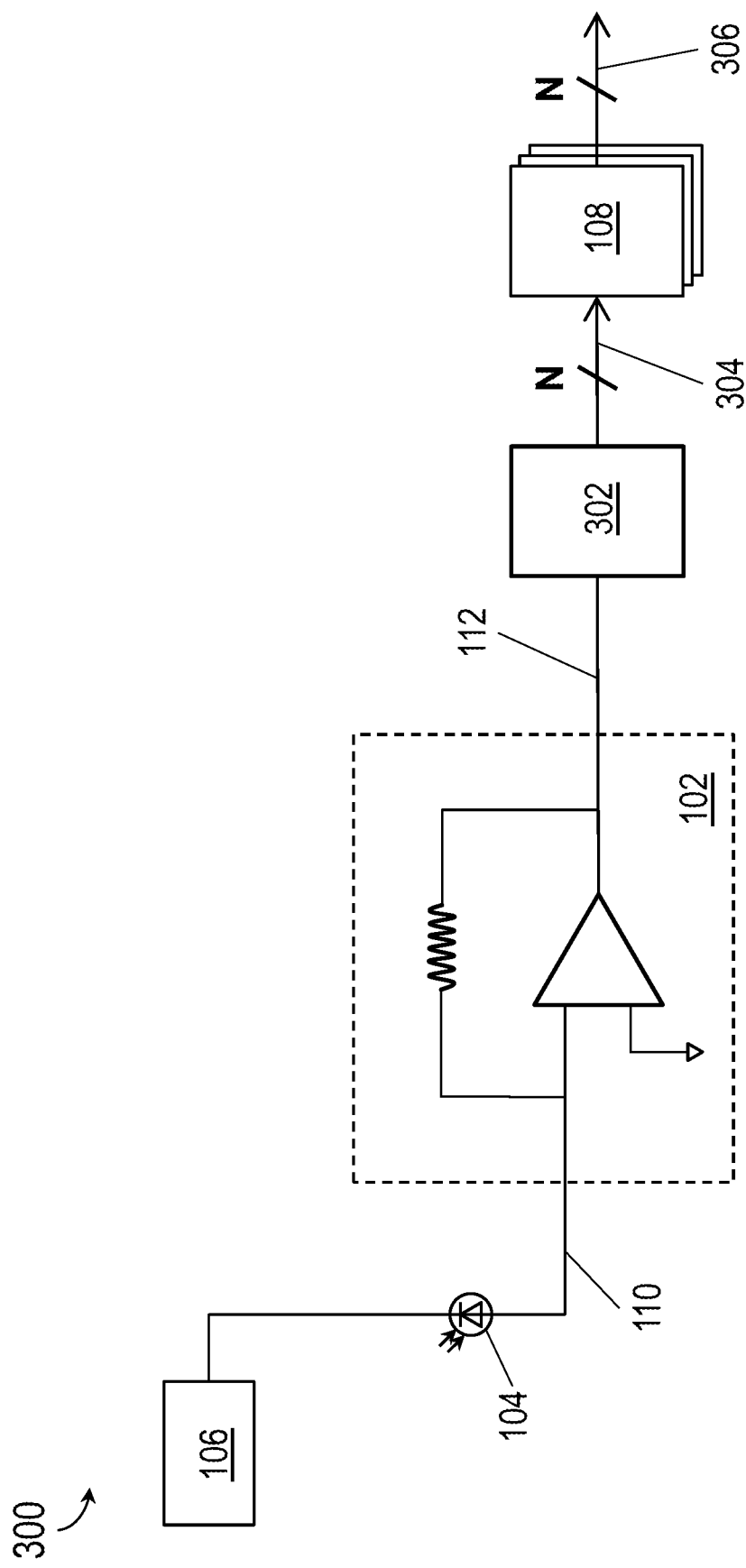
FIG. 3 is a diagrammatic illustration of a timing-tolerant multi-channel optical pulse energy conversion circuit according to example embodiments of this disclosure.

Referring now to FIG. 3, the multi-channel timing-tolerant optical pulse energy conversion circuit 300 may be implemented and may function similarly to the timing-tolerant optical pulse energy conversion circuit 100 of FIG. 1, except that the multi-channel conversion circuit 300 may be configured for output through N channels (e.g., where N is an integer not less than two). The multi-channel conversion circuit 300 may incorporate a divide-by-N divider circuit 302 and N edge-triggered sequential logic circuits 108 (e.g., one for each of N channels).

In embodiments, the multi-channel conversion circuit 300 may receive an input optical pulse stream 106 via photodetector 104, which may convert the optical pulses stream to a current pulse stream 110 (e.g., which may be periodic (110, FIG. 2A) or nonperiodic (110a, FIG. 2B)) as described above. Similarly, the current-to-voltage conversion circuit 102 may convert the current pulse stream 110 to a converted electrical waveform 112 (e.g., a periodic or nonperiodic converted electrical waveform (112, FIG. 2A; 112a, FIG. 2B)) received by the divider circuit 302. For example, the converted electrical waveform 112 may toggle latch logic circuits within the divider circuit 302 to generate N divided electrical waveforms 304 (e.g., one divided electrical waveform for each of N channels, each divided electrical waveform 304 a non-intersecting subset of the converted electrical waveform 112). In embodiments, the sequential logic circuit 108 for each channel may adjust the width window of each corresponding voltage pulse (204, FIGS. 2A/B) of its corresponding divided electrical waveform 304, the N sequential logic circuits collectively generating N adjusted-width electrical waveforms 306.

In some embodiments, the N-channel timing-tolerant optical pulse energy conversion circuit 300 may be embodied in an N-channel optical pulse energy digitizer, e.g., as disclosed by U.S. Pat. No. 10,075,154, which patent is herein incorporated by reference in its entirety.

Figure 4A:
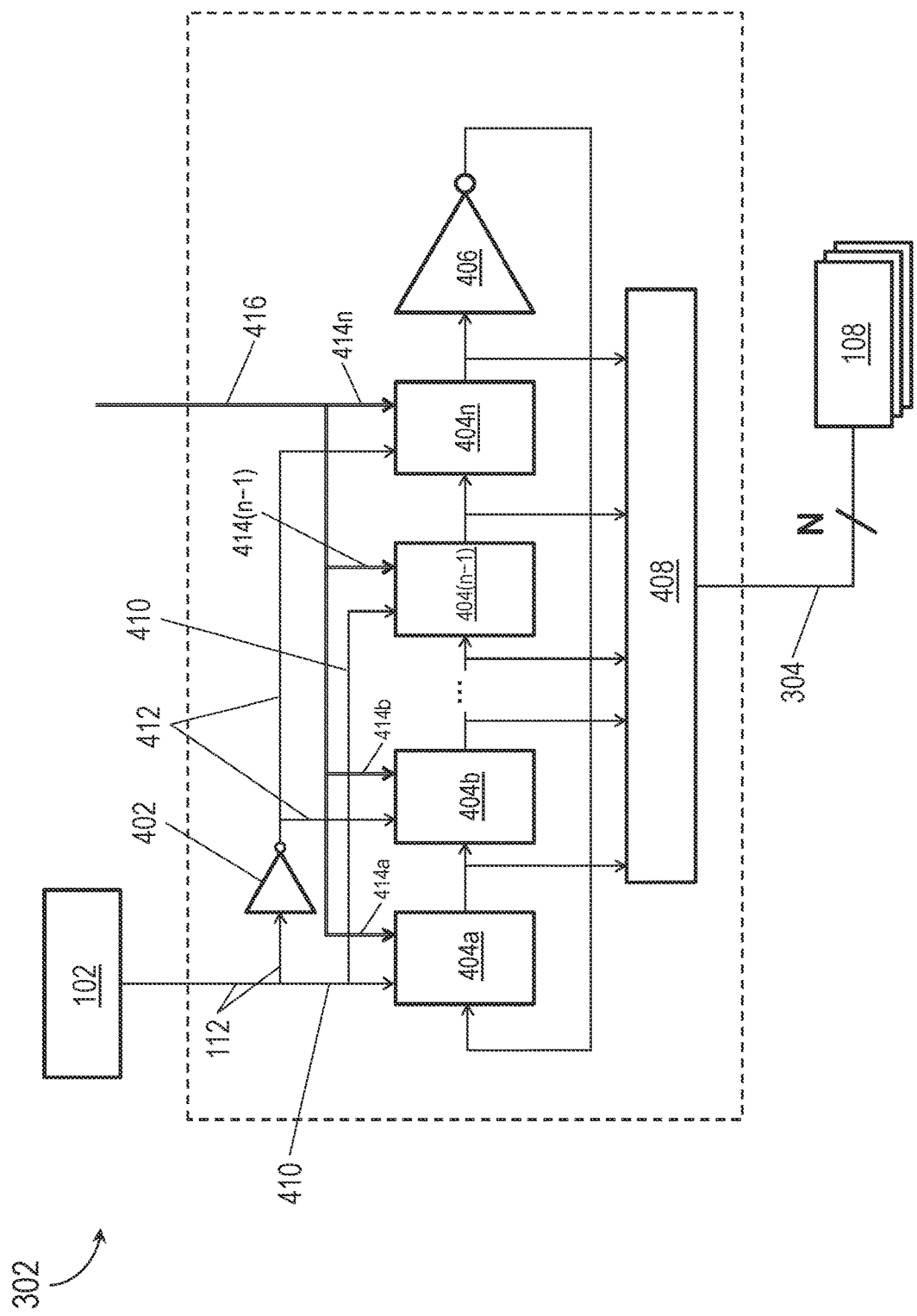
FIG. 4A is a diagrammatic illustration of a divider circuit of the multi-channel optical pulse energy conversion circuit of FIG. 3.

Referring to FIG. 4A, the divide-by-N divider circuit 302 is shown.

In embodiments, the divider circuit 302 may include an inverter 402, a set of latches 404a-404n, an inverter 406 and combination logic circuit 408, which may be a programmable logic circuit (e.g., digital or current-mode logic (CML)) or may be embodied as an array of logic gates configured for providing operations as described herein. In embodiments, the divider circuit 302 may receive the converted electrical waveform 112 from the current-to-voltage conversion circuit 102 and provide (e.g., via combination logic circuit 408) N divided electrical waveforms 304 to the N sequential logic circuits 108.

In embodiments, latch inputs 410 of odd numbered latches (e.g., latches 404a and 404(n−1)) may be provided by the converted electrical waveform 112, while latch inputs 412 of even numbered latches (e.g., latches 404b and 404n) may be coupled to an output of the inverter 402. The input of the inverter 402 may similarly be provided by the converted electrical waveform 112, such that the inverter 402 may provide inverted latch inputs 412 to the even numbered latches (e.g., 404b, 404n). Further: an input of the latch 404a may be coupled to an output of the inverter 406; an input of the inverter 406 may be coupled to an output of the latch 404n; an output of the latch 404a may be coupled to an input of the latch 404b; an output of the latch 404b may be coupled (e.g., via latches 404c, ... 404(n−2), not shown) to an input of the latch 404(n−1); and an output of the latch 404 (n−1) may be coupled to an input of the latch 404n.

In embodiments, the latches 404a-404n may include, but are not limited to, digital D-type latches or CML latches, and the inverters 402 and 406 may include (but are not limited to) digital inverters, CML inverters, NAND gates, or inverted/crossed differential signal lines (e.g., replacing the inverter 406).

In embodiments, the latches 404a-404n may include respective reset inputs 414a-414n coupled to a reset input 416. For example, a reset signal on the reset input 416 (e.g., from the sequential logic circuit 108) may allow the latches 404a-404n to be reset to a particular logic signal.

Figure 4B:
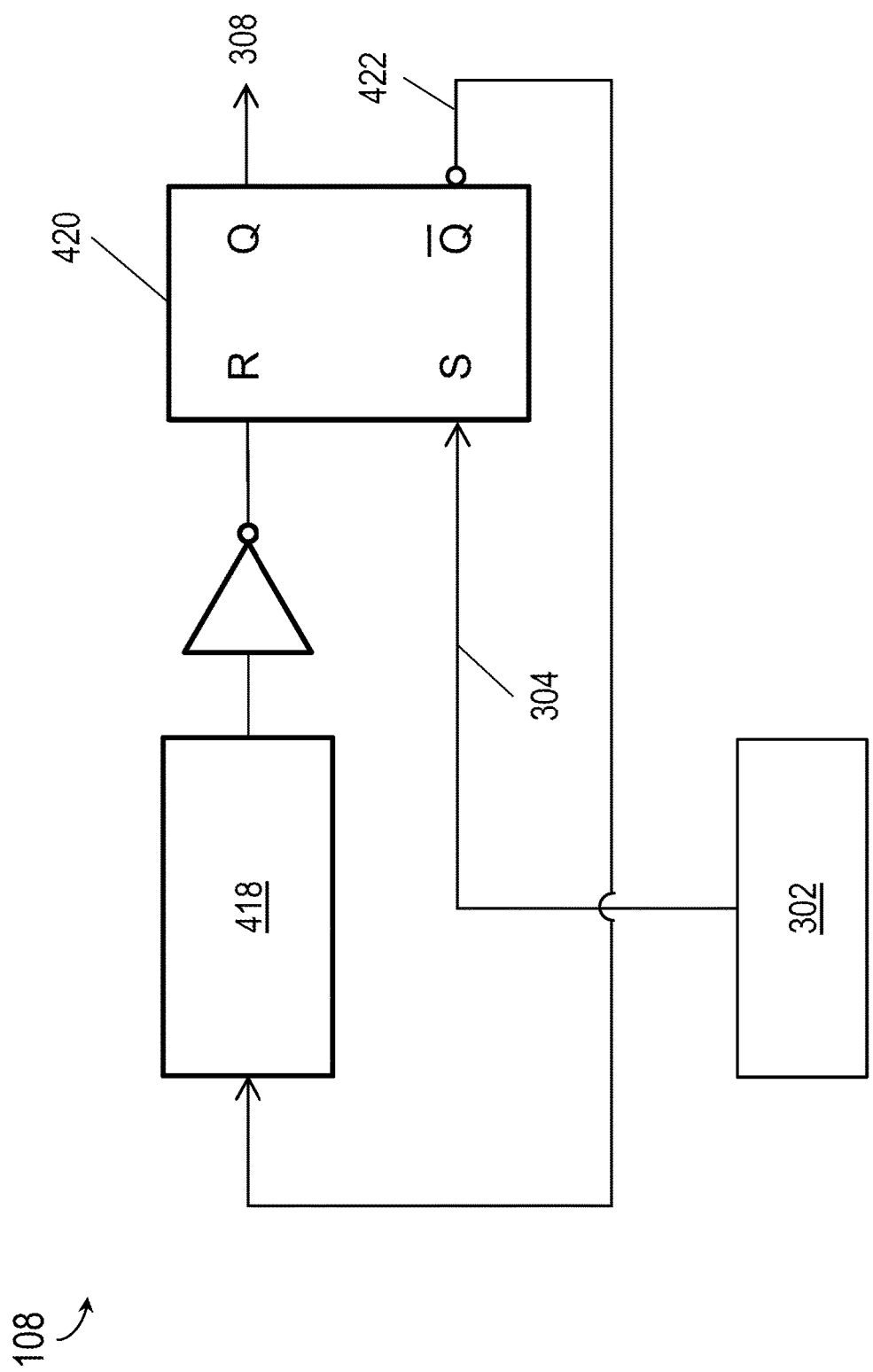
FIG. 4B is a diagrammatic illustration of sequential logic circuit circuitry of the optical pulse energy electrical conversion circuits of FIGS. 1 and 3.

Referring now to FIG. 4B, the sequential logic circuit 108 is shown. In embodiments, the N-channel conversion circuit (300, FIG. 3) may incorporate a sequential logic circuit 108 for each of its N channels. The sequential logic circuit 108 may incorporate an adjustable delay circuit 418 as well as a set/reset logic circuit 420 or other like latching or flip-flop circuits (e.g., incorporating NOR gates, NAND gates, or other like static gates as needed or desired). In embodiments, the implementation of the sequential logic circuit 108 is a non-limiting example, such that the sequential logic circuit may be implemented via other or additional circuits and/or algorithms.

In embodiments, the set/reset logic circuit 420 (e.g., for each of N channels) may receive (e.g., via a Set port S) a divided electrical waveform 304 (e.g., from the divider circuit 302; the received divided electrical waveform may set the output 422 of the set/reset logic circuit to high (e.g., Q=1 or "set"; R=0, S=1). The output 422 of the set/reset logic circuit 420 may be delayed (e.g., per the adjustable delay circuit 418) before connecting to the Reset port R of the set/reset logic circuit. In embodiments, while the output 422 remains high, the adjustable delay circuit 418 may change the pulse width (e.g., duration) of each converted voltage pulse (204a and 204b, FIGS. 5/6) of the divided electrical waveform 304, resulting in an adjusted-width electrical waveform 306, each voltage pulse of the adjusted-width electrical waveform having a fixed width and synchronous to a subset (e.g., of N subsets) of the received converted electrical waveform 112. In embodiments, when the output 422 is received by the set/reset logic circuit 420, the output may be reset to low (e.g., Q=0 or "hold"/"reset"; R=1 or 0, S=0).

In some embodiments, the multi-channel timing-tolerant optical pulse energy conversion circuit 300 of FIG. 3 may be implemented in a four-channel system (N=4) wherein, e.g., the divide-by-N divider circuit (302, FIGS. 3-4B) is a divide-by 4 divider circuit.

Figure 5:
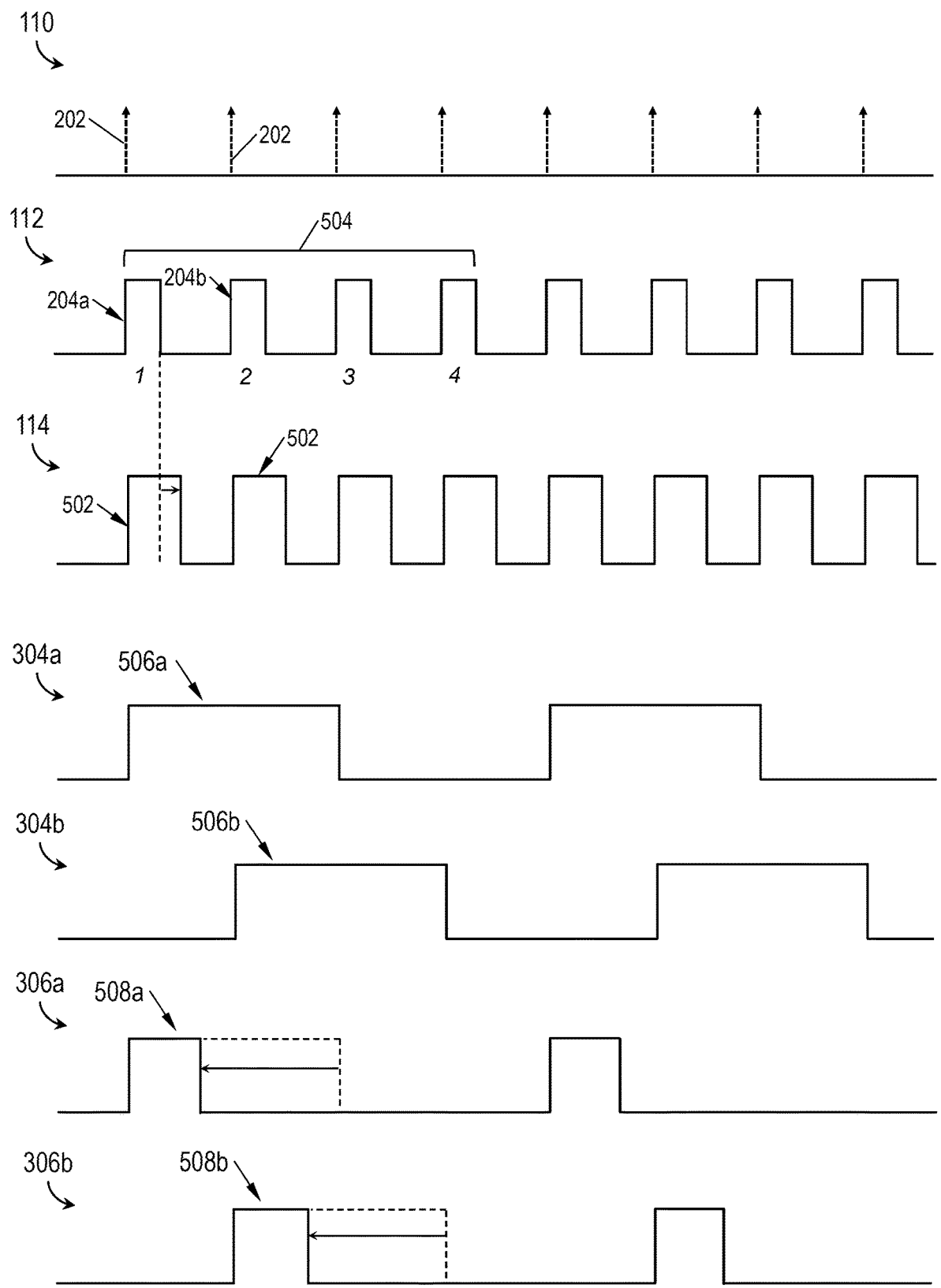
FIG. 5 illustrates operations of the multi-channel optical pulse energy conversion circuit of FIG. 3 upon a periodic input optical pulse stream.

Referring now to FIG. 5, in embodiments the single-channel conversion circuit 100 of FIG. 1 may receive the current pulse stream 110 comprising a periodic sequence of current pulses 202 and convert the periodic current pulse stream to a converted electrical waveform 112 comprising a periodic sequence of voltage pulses (204, FIG. 2A; e.g., periodic voltage pulse stream 112, FIG. 2A). In embodiments, the sequential logic circuit (108, FIG. 3) may adjust the width of each voltage pulse (502), resulting in an adjusted-width converted electrical waveform 114.

By way of a non-limiting example, with respect to the N-channel conversion circuit 300 of FIG. 3, the sequential logic circuits 108 for channels 1 and 2 (of 4) may each receive the converted electrical waveform 112 and may respectively convert every first and second voltage pulse 204a, 204b (e.g., the first and second voltage pulse of each successive set 504 of four voltage pulses), resulting in N divided electrical waveforms 304a, 304b (304c, 304d are not shown). For example, each divided electrical waveform 304a, 304b may comprise a periodic sequence of voltage pulses 506a, 506b. Each divided electrical waveform 304a, 304b may be a non-intersecting subset of the converted electrical waveform 112 corresponding to the periodic current pulse stream 110. In embodiments, the sequential logic circuit 108 may adjust (508a, 508b) the width of each voltage pulse 506a, 506b of the divided electrical waveforms 304a, 304b, resulting in N adjusted-width divided electrical waveforms 306a, 306b (306c, 306d are not shown).

Figure 6:
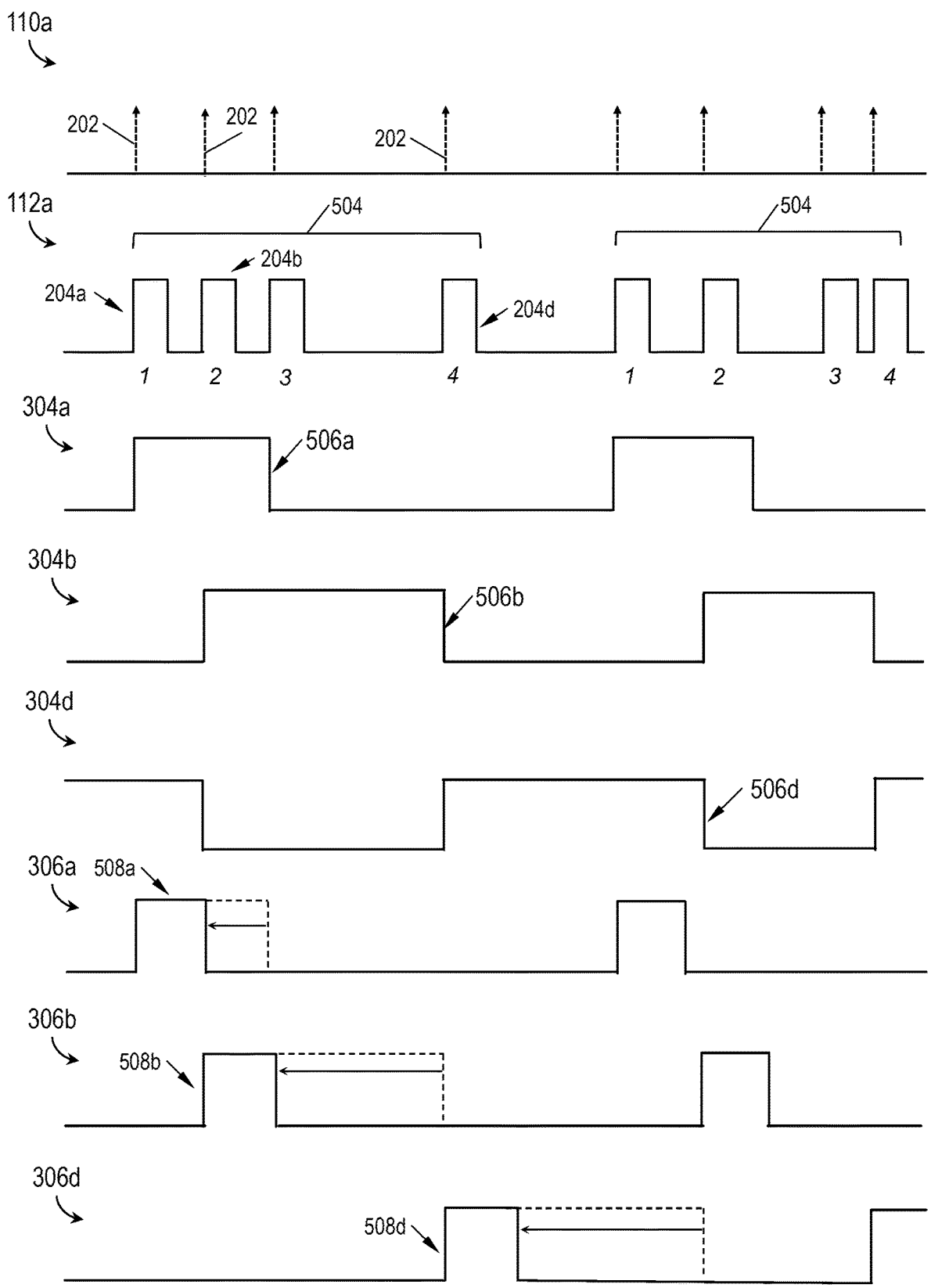
FIG. 6 illustrates operations of the timing-tolerant optical pulse energy conversion circuit of FIG. 3 upon a nonperiodic input optical pulse stream.

Referring now to FIG. 6, in embodiments the single-channel conversion circuit 100 of FIG. 1 may receive the current pulse stream 110a comprising a nonperiodic sequence of current pulses 202 and convert the nonperiodic current pulse stream to a converted electrical waveform 112a, similar to the converted electrical waveform 112 of FIG. 6 but comprising a nonperiodic sequence (e.g., 112a, FIG. 2B) of voltage pulses (204, FIG. 2B).

By way of a non-limiting example, with respect to the N-channel conversion circuit 300 of FIG. 3, the sequential logic circuits (108, FIG. 3) for channels 1, 2, and 4 (of 4; channel 3 not shown) may each receive the converted electrical waveform 112a and may respectively convert every first, second, and fourth voltage pulse 204a, 204b, 204d (e.g., the first, second, and fourth optical pulse of each successive set 504 of four voltage pulses), resulting in N (4) divided electrical waveforms 304a, 304b, 304d (304c is not shown). For example, each divided electrical waveform 304a, 304b, 304d may comprise a nonperiodic sequence of voltage pulses 506a, 506b, 506d, and each divided electrical waveform 304a, 304b, 304d may be a non-intersecting subset of the converted electrical waveform 112a corresponding to the periodic current pulse stream 110a. In embodiments, the sequential logic circuits 108 may adjust (508a, 508b, 508d) the width of each voltage pulse 506a, 506b, 506d, resulting in N (4) adjusted-width divided electrical waveforms 306a, 306b, 306d (306c is not shown).

Figure 7:
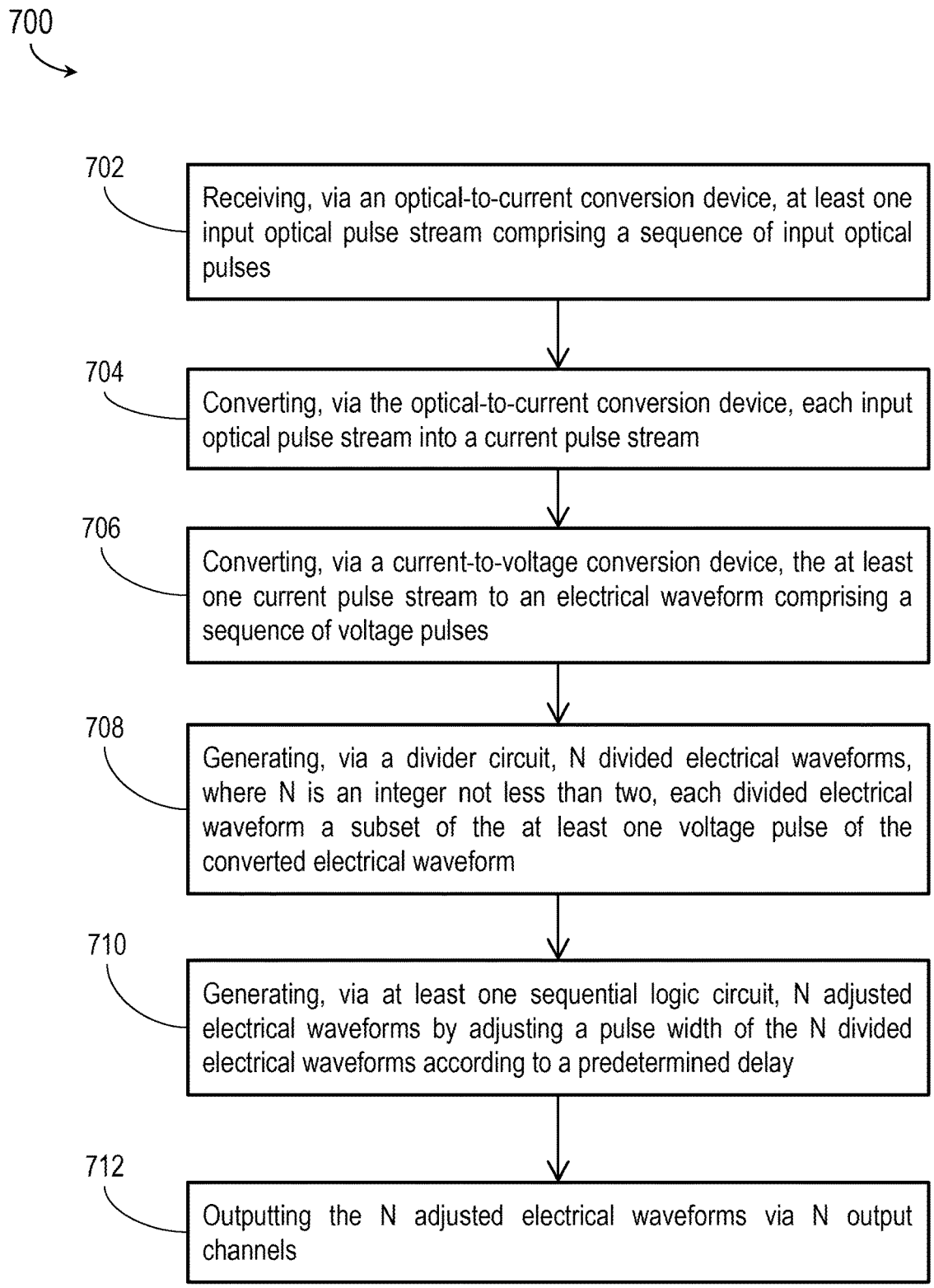
FIG. 7 is a flow diagram illustrating a method for timing-tolerant multi-channel optical pulse energy conversion according to example embodiments of this disclosure.

Referring to FIG. 7, the method 700 may be implemented by the multi-channel (e.g., N-channel) conversion circuit 300 and may include the following steps.

At a step 702, an optical-to current conversion circuit (e.g., photodetector) of the N-channel conversion circuit receives an input optical pulse stream comprising a sequence of input optical pulses. In some embodiments, the input optical pulse stream comprises a periodic or nonperiodic sequence of input optical pulses.

At a step 704, the optical-to-current conversion circuit converts the input optical pulse stream to a current pulse stream. In some embodiments, the converted current pulse stream comprises a periodic or nonperiodic sequence of current pulses corresponding to the input optical pulse stream.

At a step 706, a current-to-voltage conversion device converts the current pulse stream to an electrical waveform comprising a sequence of converted voltage pulses, each converted voltage pulse corresponding to a current pulse. In some embodiments, e.g., if the input optical pulse stream is a nonperiodic sequence of current pulses, the converted electrical waveform will likewise be a nonperiodic sequence of voltage pulses.

At a step 708, a divide-by-N divider circuit receives the converted electrical waveform and directs the N sequential logic circuits (one for each of N channels) to generate N divided electrical waveforms, each divided electrical waveform a subset of the converted electrical waveform. For example, the converted electrical waveform may trigger latch circuits within the divided circuit and accordingly send clock signals to the N sequential logic circuits such that each Mth sequential logic circuit of the Mth channel (M N) detects the leading edge of, and captures, each Mth converted voltage pulse of each successive set of N converted voltage pulses of the converted electrical waveform, the Mth divided electrical waveform comprising a sequence of each captured Mth converted voltage pulse.

At a step 710, the N sequential logic circuits generate N adjusted divided electrical waveforms by adjusting a pulse width (e.g., width window) of each converted voltage pulse of each of the N divided electrical waveforms. For example, each sequential logic circuit may detect a converted voltage pulse by its leading edge. Further, each sequential logic circuit may include a set/reset logic circuit with adjustable delay or similar means for adjusting each pulse width according to a predetermined and adjustable delay.

At a step 712, the N sequential logic circuits output the N adjusted divided electrical waveforms via N output channels. For example, the N-channel conversion circuit may be embodied in an N-channel digitizer wherein each adjusted divided electrical waveform may be further amplified and/or digitized.

CONCLUSION

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

We claim:

1. A timing-tolerant optical pulse energy conversion circuit, comprising:
   at least one photodetector configured to:
      receive at least one input optical pulse stream comprising a sequence of input optical pulses;
      and
      generate at least one current pulse stream comprising a sequence of current pulses corresponding to the sequence of input optical pulses;
   at least one current-to-voltage conversion circuit configured to:

convert each current pulse to a voltage pulse, the sequence of voltage pulses comprising a converted electrical waveform corresponding to the current pulse stream; and at least one sequential logic circuit operatively coupled to the current-to-voltage conversion circuit, the at least one sequential logic circuit configured to:

detect at least one voltage pulse of the converted electrical waveform; and generate at least one adjusted electrical waveform based on the converted electrical waveform by adjusting a width window of the at least one detected voltage pulse according to a predetermined delay.

2. The timing-tolerant optical pulse energy conversion circuit of claim 1, wherein the current pulse stream comprises a nonperiodic sequence of one or more current pulses; and the converted electrical waveform comprises a nonperiodic sequence of one or more voltage pulses.

3. The timing-tolerant optical pulse energy conversion circuit of claim 1, wherein the at least one sequential logic circuit includes an edge-triggered sequential logic circuit configured to detect a leading edge of the at least one voltage pulse.

4. The timing-tolerant optical pulse energy conversion circuit of claim 1, wherein the conversion circuit is an N-channel conversion circuit and the at least one sequential logic circuit is an array of N sequential logic circuits, where N is an integer, further comprising:

at least one divide-by-N divider circuit operatively coupled to the at least one current-to-voltage conversion circuit and configured to receive the converted electrical waveform therefrom, the divider circuit comprising a series of N latches coupled to a combination logic circuit, the series of N latches configured to generate one or more clock signals responsive to the at least one voltage pulse of the converted electrical waveform, the combination logic circuit configured to forward the one or more clock signals to the array of N sequential logic circuits, such that each Mth sequential logic circuit, where M is an integer not more than N, is configured to:

generate a divided electrical waveform comprising each Mth voltage pulse of each successive sequence of N voltage pulses of the converted electrical waveform; and generate at least one adjusted electrical waveform based on the divided electrical waveform by adjusting a width window of each Mth voltage pulse according to the predetermined delay.

5. The timing-tolerant optical pulse energy conversion circuit of claim 4, wherein each Mth sequential logic circuit is configured to output the at least one adjusted electrical waveform via an Mth output channel.

6. A method for multi-channel timing-tolerant optical pulse energy conversion, the method comprising:

receiving, via an optical-to-current conversion device, at least one input optical pulse stream comprising a sequence of input optical pulses;

converting, via the optical-to-current conversion device, each input optical pulse stream into a current pulse stream;

converting, via a current-to-voltage conversion device, the at least one current pulse stream to an electrical waveform comprising a sequence of voltage pulses;

generating, via a divider circuit, N divided electrical waveforms, where N is an integer not less than two, each divided electrical waveform comprising a subset of the sequence of voltage pulses;

generating, via at least one sequential logic circuit, N adjusted electrical waveforms by adjusting a width window of each voltage pulse of the N divided electrical waveforms; and outputting the N adjusted electrical waveforms via N output channels.

7. The method of claim 6, wherein:

the input optical pulse stream comprises a nonperiodic sequence of input optical pulses; and the electrical waveform comprises a nonperiodic sequence of voltage pulses.

8. The method of claim 6, wherein generating, via a divider circuit, N divided electrical waveforms, where N is an integer not less than two, each divided electrical waveform a subset of the sequence voltage pulses includes:

generating N divided electrical waveforms, each Mth divided electrical waveform corresponding to each Mth of N channels and comprising a subset of the Mth voltage pulse of each successive sequence of N voltage pulses of the converted electrical waveform, where M is an integer not more than N.

9. The method of claim 8, wherein generating, via at least one sequential logic circuit, N adjusted electrical waveforms by adjusting a width window of each voltage pulse of the N divided electrical waveforms includes:

detecting, via the N sequential logic circuits, a leading edge of the at least one voltage pulse of the N divided electrical waveforms.

10. The method of claim 6, wherein generating, via at least one sequential logic circuit, N adjusted electrical waveforms by adjusting a width window of each voltage pulse of the N divided electrical waveforms includes:

adjusting, via the at least one sequential logic circuit, a width window of each voltage pulse of the N divided electrical waveforms according to a predetermined delay.

\* \* \* \* \*